United States Patent
Kurimoto et al.

(10) Patent No.: US 10,416,220 B2
(45) Date of Patent: Sep. 17, 2019

(54) DETERIORATION DIAGNOSIS DEVICE

(71) Applicant: Mitsubishi Electric Corporation, Chiyoda-ku, Tokyo (JP)

(72) Inventors: Masanori Kurimoto, Tokyo (JP); Yuki Iwagami, Tokyo (JP); Yoshitake Nishiuma, Tokyo (JP); Takayuki Yanai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 15/424,242

(22) Filed: Feb. 3, 2017

(65) Prior Publication Data

US 2017/0356947 A1     Dec. 14, 2017

(30) Foreign Application Priority Data

Jun. 8, 2016   (JP) .................................. 2016-114055

(51) Int. Cl.
  *G01R 31/3187*  (2006.01)
  *G01R 31/00*  (2006.01)
  *G01R 31/28*  (2006.01)

(52) U.S. Cl.
  CPC ....... *G01R 31/007* (2013.01); *G01R 31/2884* (2013.01)

(58) Field of Classification Search
  CPC ...... G01R 31/00; G01R 31/007; G01R 31/28; G01R 31/2884
  See application file for complete search history.

(56) References Cited

U.S. PATENT DOCUMENTS

| 9,106,104 | B2 * | 8/2015 | Kinjo | ........................ H02J 3/32 |
| 10,038,325 | B2 * | 7/2018 | Kobayashi | .......... H01M 10/482 |

(Continued)

FOREIGN PATENT DOCUMENTS

| JP | 2003-65098 A | 3/2003 |
| JP | 2004-521222 A | 7/2004 |

(Continued)

OTHER PUBLICATIONS

Communication dated May 9, 2017, from the Japanese Patent Office in counterpart application No. 2016-114055.

(Continued)

*Primary Examiner* — Thang X Le
(74) *Attorney, Agent, or Firm* — Sughrue Mion, PLLC; Richard C. Turner

(57) ABSTRACT

Even when parts having individual differences among identical parts or differences in deterioration speed between parts, or a part that does not have a non-volatile memory such as an EEPROM in a chip of the part itself, are mixed, there is no deterioration diagnosis device that can appropriately diagnose a state of deterioration due to temporal change or the like, because of which a mechanism (correction methodology) for evaluating and correcting deterioration in the precision or performance of an electronic part that has low precision or considerable temporal deterioration, and does not have a correction function, is incorporated in a deterioration diagnosis device, and a deterioration state is diagnosed using incorporated deterioration determination means when using a product after shipping.

7 Claims, 9 Drawing Sheets

(56) References Cited

U.S. PATENT DOCUMENTS

| | | | |
|---|---|---|---|
| 2004/0094119 A1 | 5/2004 | Dietl et al. | |
| 2006/0198211 A1* | 9/2006 | Frankowsky | G01R 31/2831 365/189.09 |
| 2006/0247882 A1* | 11/2006 | Tada | G01R 31/31932 702/117 |
| 2009/0027313 A1* | 1/2009 | Miyamoto | G09G 3/3233 345/76 |
| 2011/0106399 A1 | 5/2011 | Asano et al. | |
| 2013/0338867 A1* | 12/2013 | Sato | B60W 10/06 701/22 |
| 2015/0134192 A1 | 5/2015 | Kakinuma | |
| 2016/0195588 A1* | 7/2016 | Ikeda | H01M 10/48 324/430 |

FOREIGN PATENT DOCUMENTS

| | | |
|---|---|---|
| JP | 2006275929 A | 10/2006 |
| JP | 2007-192136 A | 8/2007 |
| JP | 2011-094588 A | 5/2011 |
| JP | 2013246011 A | 12/2013 |
| JP | 2016-90939 A | 5/2016 |

OTHER PUBLICATIONS

Communication dated Oct. 30, 2018, issued by the Japanese Patent Office in counterpart application No. 2017-120138.
Communication dated Apr. 1, 2019 issued by the State Intellectual Property Office of People's Republic of China in counterpart application No. 201710403310.1.

\* cited by examiner

FIG.7A

| | | TEMPERATURE (C) | | | |
|---|---|---|---|---|---|
| | | C1 | C2 | ... | Cm |
| AIR PRESSURE (P) | P1 | I1-110 | I1-120 | ... | I1-1m0 |
| | P2 | I1-210 | I1-220 | ... | I1-2m0 |
| | ... | ... | ... | ... | ... |
| | Pl | I1-l10 | I1-l20 | ... | I1-lm0 |

FIG.7B

| | | TEMPERATURE (C) | | | |
|---|---|---|---|---|---|
| | | C1 | C2 | ... | Cm |
| AIR PRESSURE (P) | P1 | I2-110 | I2-120 | ... | I2-1m0 |
| | P2 | I2-210 | I2-220 | ... | I2-2m0 |
| | ... | ... | ... | ... | ... |
| | Pl | I2-l10 | I2-l20 | ... | I2-lm0 |

FIG.7C

| | | TEMPERATURE (C) | | | |
|---|---|---|---|---|---|
| | | C1 | C2 | ... | Cm |
| AIR PRESSURE (P) | P1 | I3-110 | I3-120 | ... | I3-1m0 |
| | P2 | I3-210 | I3-220 | ... | I3-2m0 |
| | ... | ... | ... | ... | ... |
| | Pl | I3-l10 | I3-l20 | ... | I3-lm0 |

FIG.8

| | | TEMPERATURE (C) | | | |
|---|---|---|---|---|---|
| | | C1 | C2 | ... | Cm |
| AIR PRESSURE (P) | P1 | I1-111 | I1-121 | ... | I1-1m1 |
| | P2 | I1-211 | I1-221 | ... | I1-2m1 |
| | ... | ... | ... | ... | ... |
| | Pl | I1-l11 | I1-l21 | ... | I1-lm1 |

(additional layers: I1-1m2 ... I1-lm2 ... I1-1mn, I1-2mn, ..., I1-lmn)

| | | TEMPERATURE (C) | | | |
|---|---|---|---|---|---|
| | | C1 | C2 | ... | Cm |
| AIR PRESSURE (P) | P1 | a12-111,b12-111 | a12-121,b12-121 | ... | a12-1m1,b12-1m1 |
| | P2 | a12-211,b12-211 | a12-221,b12-221 | ... | a12-2m1,b12-2m1 |
| | ... | ... | ... | ... | ... |
| | Pi | a12-i11,b12-i11 | a12-i21,b12-i21 | ... | a12-im1,b12-im1 |
| | ... | ... | ... | ... | ... |
| | Pi | a23-i11,b23-i11 | a23-i21,b23-i21 | ... | a23-im1,b23-im1 |

| | | TEMPERATURE (C) | | | |
|---|---|---|---|---|---|
| | | C1 | C2 | ... | Cm |
| AIR PRESSURE (P) | P1 | a12-112,b12-112 | a12-122,b12-122 | ... | a12-1m2,b12-1m2 |
| | P2 | a12-212,b12-212 | a12-222,b12-222 | ... | a12-2m2,b12-2m2 |
| | ... | ... | ... | ... | ... |
| | Pi | a12-i12,b12-i12 | a12-i22,b12-i22 | ... | a12-im2,b12-im2 |
| | ... | ... | ... | ... | ... |
| | Pi | a23-i11,b23-i11 | a23-i22,b23-i22 | ... | a23-im2,b23-im2 |

DETERIORATION DIAGNOSIS DEVICE

BACKGROUND OF THE INVENTION

Field of the Invention

The present invention relates to a deterioration diagnosis device that diagnoses a state of deterioration of electronic part characteristics due to temporal change or the like.

Description of the Related Art

Electronic parts are used in products in a variety of fields. Electronic parts for industrial plant equipment, a powertrain mounted in an automobile, and the like, are required to be able to operate over a long period while maintaining reliability. However, electrical and electronic instruments are such that deterioration advances due to various kinds of stress such as environmental stress, electrical stress, and mechanical stress, because of which preventive maintenance and maintenance management need to be carried out at an appropriate time.

With regard to electrical and electronic instruments mounted in an automobile too, compliance with functional safety standards is important, and there are strict requirements regarding mounted electronic part characteristics and accuracy, and compliance with failure criteria, for a powertrain electronic control unit (ECU).

High cost materials with little individual difference or temporal deterioration are used in a micro-control unit (MCU) or high cost general purpose IC, and there are materials wherein an operating state is corrected in accordance with temporal change by the material having a non-volatile memory such as an EEPROM in a chip of the material itself in order to correct characteristics.

For example, in the field of engine control, a correlation between an amount of actuator control and a combustion parameter, and a correlation between a combustion parameter and an engine output value, are realized by a determinant or model, whereby an actuator workload appropriate to a target engine output can be derived. Because of this, a correlation change is responded to by providing a function that causes learning of actuator control amount calculation with respect to a combustion parameter, with high dependency on environmental condition change and temporal deterioration (Patent literature 1). Technology disclosed in Patent literature 1 is such that a combustion parameter is detected multiple times with respect to the same control amount, and the learning function is realized by employing an average value at a normal time, and a weighting when a transition time is used.

Also, in Patent literature 2, a spark that causes ignition of an air-fuel mixture is identified from one or a multiple of continuous ignition sparks released in a cylinder filled with the mixture, a time interval for which a predetermined mechanical power supply by an internal combustion engine is guaranteed is assessed from the spark release, and a point at which a fuel injector valve is opened is amended so that subsequent ignition is carried out at a predetermined point, because of which an optimum ignition spark is emitted once.

Also, Patent literature 3 is such that when an amount of fuel injected (total fuel injection amount) in one injector cycle exceeds an injection amount switch threshold, EGR means is controlled based on the concentration of oxygen in exhaust gas detected by an exhaust gas oxygen concentration sensor, and when the amount of fuel injected is equal to or less than the injection amount switch threshold, the EGR means is controlled based on an amount of new air detected by a new air amount sensor. Also, when learning an injection amount, a difference between a commanded fuel injection amount and an amount of fuel actually injected is calculated as a learning value, and injection amount variation caused by temporal deterioration of an injector or the like is combated by each injection amount switch threshold of an injection amount switch threshold map being corrected in accordance with the learning value.

Furthermore, Patent literature 4 discloses an engine performance diagnosis system including a sensor that measures a physical amount relating to engine performance, a controller that automatically sets engine load conditions and engine speed to constants in a diagnosis mode and automatically stores the physical amount relating to engine performance measured by the sensor, and a monitor on which is displayed a temporal change in the physical amount relating to engine performance stored in the controller, wherein the engine performance differs in accordance with the engine load conditions and engine speed, but highly accurate engine performance diagnosis can easily be carried out by the controller automatically setting these testing conditions to constants every time. Furthermore, Patent literature 4 discloses that even when there is variation in measurement data due to an engine or machine, a temporal change in engine performance can be accurately ascertained, and the need or otherwise for an overhaul can be accurately determined, by storing and accumulating measurement data of the physical amount relating to engine performance measured by the sensor from the time the vehicle is new, with an engine of the same chassis. Also, by a temporal change in measurement data of the physical amount relating to engine performance being displayed on the monitor, engine performance diagnosis can be carried out where the data are measured.

[Patent literature 1] JP-A-2011-94588
[Patent literature 2] JP-T-2004-521222 (the term. "JP-T" as used herein means a published Japanese translation of a PCT patent application)
[Patent literature 3] JP-A-2007-192136
[Patent literature 4] JP-A-2003-65098

A general ECU includes an MCU, a general purpose IC, and individual electronic parts, and integrates an application specific integrated circuit (ASIC). It is often the case with components on an ECU that not only are there individual differences among identical parts, but also the speed of temporal deterioration differs between parts, and when attempting to arrange that all parts, including correction means, are high precision parts with little deterioration, cost increases, and no profit can be made. However, depending on the region and extent of deterioration, the deterioration may affect an essential function of the ECU, and there may be a noticeable loss of reliability.

SUMMARY OF THE INVENTION

The invention has an object of providing a deterioration diagnosis device such that a state of deterioration due to temporal change or the like can be appropriately diagnosed, even when parts such that there are individual differences among identical parts or differences in deterioration speed between parts, or a part that does not have a non-volatile memory such as an EEPROM in a chip of the part itself, are mixed.

A deterioration diagnosis device of the invention has output information with respect to a reference in a state wherein there is no deterioration of an individual electronic part, which is a target, and output information in a state of deterioration with respect to the reference at a predetermined point of use, receives an output signal of the individual electronic part with respect to the reference, and carries out a diagnostic evaluation of a deterioration state of the individual electronic part from the output information in the state wherein there is no deterioration and the output information in the deterioration state.

The invention is such that, by including a function that carries out diagnosis of a deterioration state of an individual electronic part having low precision or considerable deterioration, the individual electronic part having low precision or considerable deterioration can be used, and output of the individual electronic part can be corrected based on the diagnosis of the deterioration state.

The foregoing and other objects, features, aspects, and advantages of the invention will become more apparent from the following detailed description of the invention when taken in conjunction with the accompanying drawings.

BRIEF DESCRIPTION OF THE DRAWINGS

FIG. 7A is a diagram showing a condition reference table;
FIG. 7B is a diagram showing a condition reference table;
FIG. 7C is a diagram showing a condition reference table;

FIG. 8 is a diagram showing a deterioration characteristic table;

DETAILED DESCRIPTION OF THE PREFERRED EMBODIMENTS

First Embodiment

Figure 1:
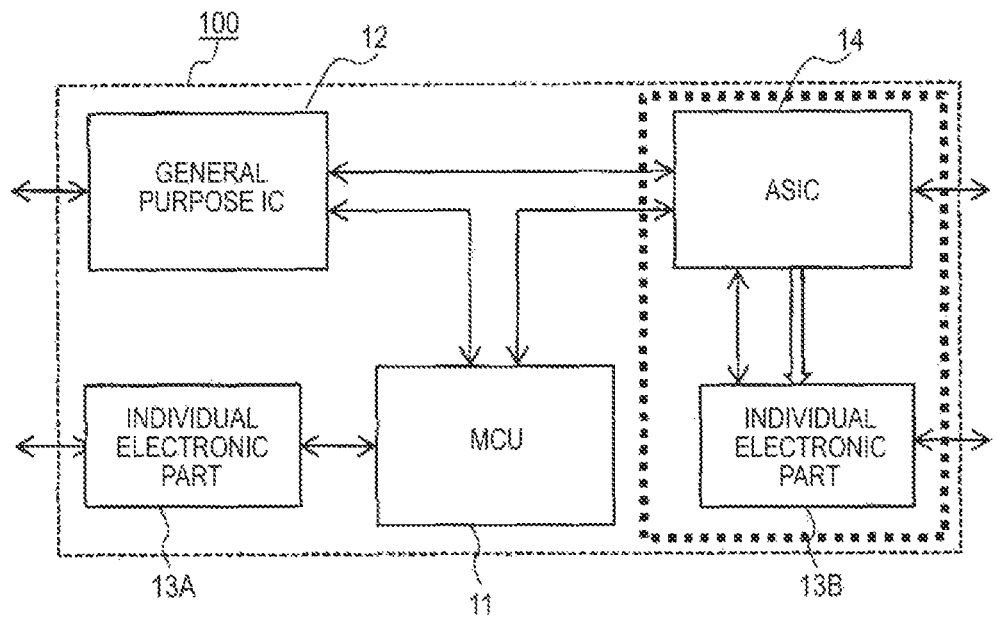
FIG. 1 is a configuration diagram showing an outline of a first embodiment of the invention.

Hereafter, as a first embodiment of the invention, a description will be given of a case wherein the invention is applied to a general ECU. As shown in FIG. 1, a general ECU 100 is configured of an MCU 11, a general purpose IC 12, a first individual electronic part 13A, and a second individual electronic part 13B, and an application specific integrated circuit (ASIC) 14 integrates the second individual electronic part 13B. Herein, the first individual electronic part 13A is an electronic part with high precision or little temporal deterioration and having a correction function, and the second individual electronic part 13B is an electronic part with low precision or considerable temporal deterioration and having no correction function. In the drawings, the same reference signs indicate identical or corresponding portions.

It is often the case with the parts configuring the ECU 100 that not only are there individual differences among identical parts, but also the speed of temporal deterioration differs between parts, and when attempting to arrange that all parts, including correction means, are high precision parts with little deterioration, cost increases, and no profit can be made. Therefore, using another electronic part, a deterioration diagnosis is carried out on the second individual electronic part 13B, which is of low precision or considerable temporal deterioration and has no correction function, and reliability of the ECU 100 is increased by issuing a warning, correcting parameters for evaluation, or adding a correction to an output value of the second individual electronic part 13B as necessary.

That is, the second individual electronic part 13B is in a weak position, and correction of the weak second individual electronic part 13B necessary for control is carried out under the protection of the ASIC 14 (hereafter, protecting an electronic part in a weak position and carrying out correction in this way will be ranked as "protective correction". Consequently, in the following description, "protective correction target" refers to the above-described second individual electronic part 13B, and an action by the ASIC 14 is "protective correction").

Figure 2:
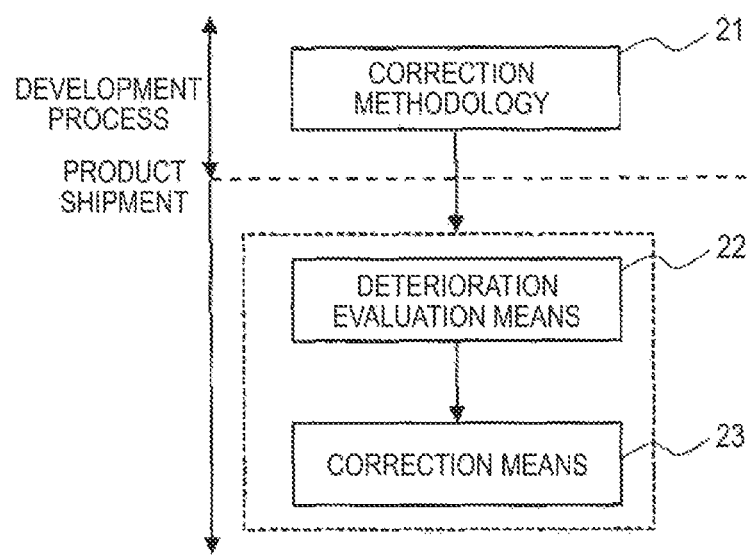
FIG. 2 is a schematic view showing a realization procedure of the invention.

A mechanism (correction methodology 21) for evaluating and correcting deterioration in the precision or performance of the second individual electronic part 13B is such that, as shown in FIG. 2, protective correction of the deterioration of the deteriorated part is carried out using an electronic part (corresponding here to the ASIC 14) having deterioration evaluation means 22, which is incorporated in a development process before a product is shipped and evaluates a deterioration state using deterioration determination means incorporated in the development process when the product is used after shipping, and correction means 23, which carries out protective correction of the deteriorated part (corresponding here to the second individual electronic part 13B) in accordance with a result of the evaluation.

Figure 3:
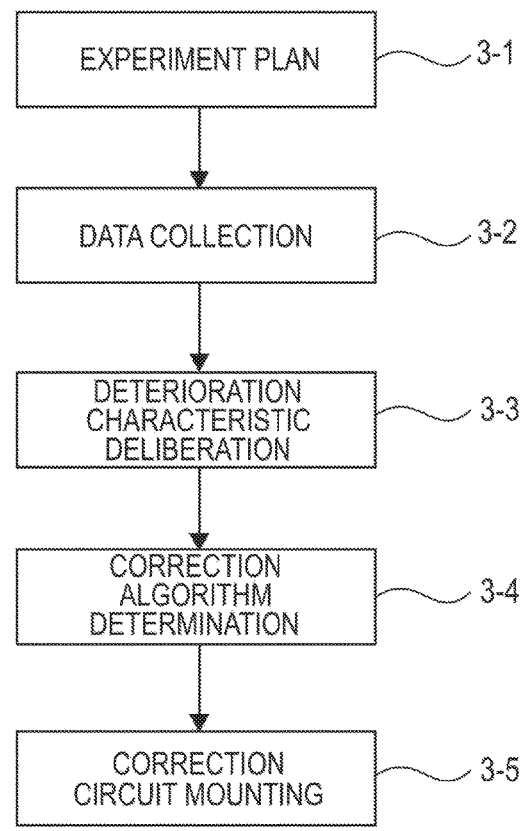
FIG. 3 is a flowchart showing steps of a development process of the invention.

The incorporation in the development process is implemented in accordance with a flow shown in FIG. 3.

Step 3-1: in an experiment plan step, references having already known measurement values and a quantity thereof, external factors thought to affect measurement results and upper and lower limit values thereof, a parameter quantity, and steps are determined for a protective correction target (for example, the second individual electronic part 13B of FIG. 1).

Step 3-2: in a data collection step, reference measurement data for the protective correction target are collected based on step 3-1.

Step 3-3: in a deterioration characteristic deliberation step, an acceleration test using references is carried out on the protective correction target, and an upper deterioration limit is determined from deterioration characteristics under each usage condition, allowable precision, and product lifespan.

Step 3-4: in a correction algorithm determination step, a correction algorithm based on theory supported by the results of steps 3-2 and 3-3 is deliberated and determined.

Step 3-5: in a correction circuit mounting step, the correction algorithm determined in step 3-4 is mounted in an electronic part that carries out protective correction (corresponding to the ASIC 14 in the example of FIG. 1). The correction algorithm may be realized as hardware only, or may be realized using software.

The hardware may all be customized articles such as the ASIC 14, or may be a combination of individual semiconductors, including external semiconductors.

Figure 4:
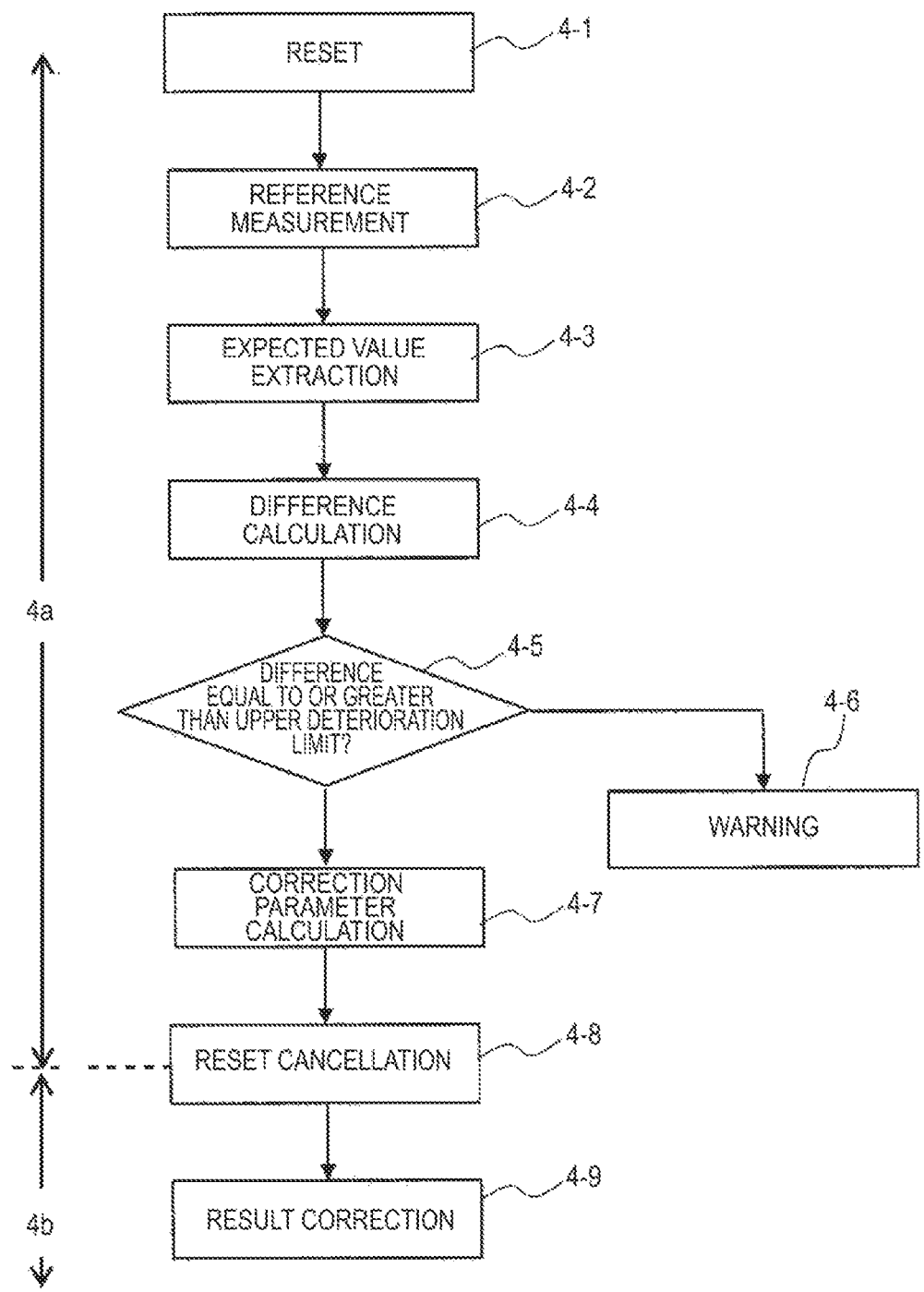
FIG. 4 is a flowchart showing an actual evaluation and a correction procedure of the invention.

Actual correction means after the product is shipped is executed in accordance with a flowchart shown in FIG. 4. The actual correction means is divided into steps from step 4-1 to step 4-8, called a calibration mode 4a, and steps from step 4-8 to step 4-9, called a normal mode 4b. The calibration mode 4a is an initial mode when starting up a power supply, and a shift may be made to this mode using a switch such as a reset.

Step 4-1: in a reset step, the device is started up in the calibration mode 4a, which is an initial state when the power supply is started up or when the reset switch is pressed.

Step 4-2: in a reference measurement step, results of measuring the protective correction target using references having already known measurement values are stored.

Step 4-3: in an expected value extraction step, expected values corrected in accordance with external usage conditions are calculated from expected protective correction target values with respect to the already known references.

Step 4-4: in a difference calculation step, differences between the measurement values of step 4-2 and expected values of step 4-3 are calculated.

Step 4-5: in a difference comparison step, a difference and the upper deterioration limit are compared.

Step 4-6: in a warning step, an element replacement warning with respect to the protective correction target is issued when the difference is greater than the upper deterioration limit.

Step 4-7: in a correction parameter calculation step, the difference is less than the upper deterioration limit, correction parameters are calculated based on the correction algorithm already mounted based on the state of deterioration of the protective correction target, and notification of the deterioration state is issued as necessary based on the relationship with the upper deterioration limit.

Step 4-8: in a reset cancellation step, the detection target of the protective correction target is switched from the references to an actual detection target, and the mode is shifted from calibration to normal, thereby cancelling the reset state.

Step 4-9: in a result correction step, the actual measurement values from the protective correction target are corrected using correction expressions based on the correction parameters calculated in step 4-7, and results of the corrections are output in real time.

Figure 5:
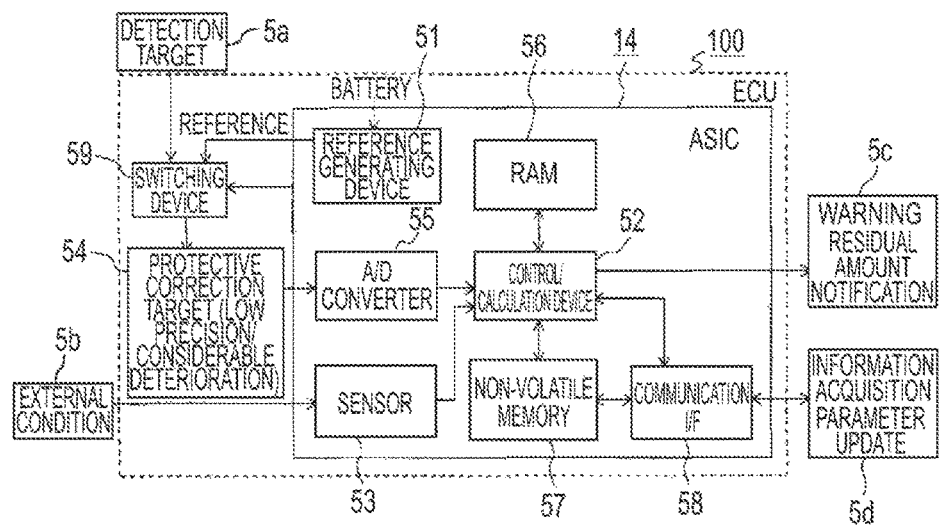
FIG. 5 is a configuration diagram of the first embodiment of the invention.

A hardware configuration when implementing the invention is shown in FIG. 5.

In this embodiment, a description will be given of an example wherein a current magnitude detection circuit used for open valve detection during direct engine injection control, or for oxygen concentration detection during air-fuel ratio control, is the protective correction target. A rated current supply is a reference, and current output from a sensor is an actual detection target.

As shown in FIG. 5, the ECU 100 is configured of a reference generating device 51 that generates a high precision reference from a battery, a sensor 53 that transmits an external usage condition to a control/calculation device 52 as a physical amount, an A/D converter 55 that converts an analog value, which is a measurement result from a protective correction target 54, into a digital signal, a RAM 56 that temporarily saves the measurement value, a non-volatile memory 57 that stores parameters, data, programs, and correction results necessary for correction, the control/calculation device 52, which carries out a determination or calculation while accessing the RAM 56 or non-volatile memory 57, and a communication interface 58 used for referencing information from the exterior of the ECU 100 saved in the non-volatile memory 57 and initializing or updating parameters and programs in the non-volatile memory 57, these configurations form the semiconductor device (ASIC) 14 integrated as one electronic part, and with respect to the semiconductor device (one portion of a sensor group thereof may be removed to the exterior as an external part), the ECU 100 is configured of a switching device 59 for switching between the reference forming the detection target and the actual detection target, and the protective correction target 54. This is the configuration of the electronic control device called the ECU 100. The communication interface 58 carries out communication to a device 5d, which is provided on the exterior and carries out information acquisition and parameter updating. Also, the configuration is such that the element replacement warning with respect to the protective correction target in the warning step of step 4-6 is issued from the control/calculation device 52 to a device 5c provided on the exterior.

Figure 6:
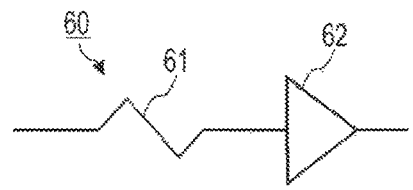
FIG. 6 is a configuration diagram showing a current detection device example.

Herein, a specific example of a current detection circuit 60 is shown as the protective correction target 54. As shown in FIG. 6, the current detection circuit 60 is configured of resistance 61 through which the current flows, and an amplifier 62 for amplifying a minute detection range thereof.

The correction methodology is deliberated in accordance with the flow of FIG. 3 in the development process of the ECU 100. Firstly, a detection target 5a with respect to the protective correction target 54, external conditions 5b when using the ECU 100, an operating range including deterioration, and references are determined. In the first embodiment, environmental temperature and air pressure are envisaged as external usage conditions and, for example, three kinds of rated current supply I1, I2, and I3 are used as references. The object is to detect performance deterioration of the current detection circuit 60, which is the protective correction target, and correct the sensor output current, which is the actual detection target. Each rated current supply is generated by the reference generating device 51, which is a component of FIG. 5.

Next, an experiment plan for determining upper and lower limits of parameters to be collected, the parameter quantity, inter-parameter steps, and deterioration characteristics is formulated at the development stage.

Then, when collection of data based on the experiment plan is finished, the kinds of condition reference table shown in FIGS. 7A, 7B, and 7C are compiled for each reference (the rated current supplies I1, I2, and I3) from results of measurements with respect to the ideal state (no deterioration) references (the rated current supplies I1, I2, and I3) under each external usage condition (temperature and air pressure). For example, with respect to the reference I1, ideal condition (taken to be T0) measurement values at an air pressure P1 and temperature C1 are registered as I1-P1_C1_T0, abbreviated to I1-110. In the same way, measurement values in a state of no deterioration at an air pressure P2 and temperature C1 are registered as I1-210, and by changing the parameters, the I1 condition reference table is compiled as shown in FIG. 7A. In the same way, reference tables are compiled for the references I2 and I3 as shown in FIGS. 7B and 7C.

Next, accelerated deterioration points with respect to the protective correction target, for example, time (fixed in units of year, month, day, and time) points T1 and T2 after the product is shipped, and an upper deterioration limit point Tn are determined. Deterioration characteristics under each usage condition are collected using the protective correction target accelerated based on the data collection conditions and the references (the rated current supplies I1, I2, and I3), and tabulated. For example, as shown in FIG. 8, the values of the reference I1 with respect to the ideal state value I1-110 of I1 under the conditions P1 and C1 after T1 and T2 elapse are registered as I1-111 and I1-112 respectively, and the upper deterioration limit value is registered as I1-11$n$. By the references I2 and I3 also being measured and registered in the same way, a deterioration characteristic table is compiled for each reference (the rated current supplies I1, I2, and I3).

Figure 9:
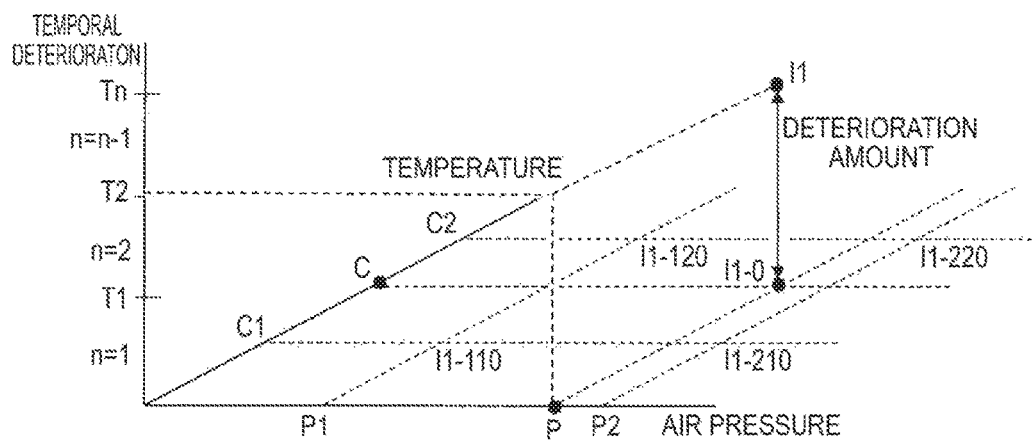
FIG. 9 is a relationship diagram showing an ideal value of a reference under a characteristic condition, and an amount of depreciation thereof.

In the calibration mode 4$a$ at a time of actual use, deterioration of the protective correction target is evaluated using the tables and reference measurement values. When the relevant external usage condition is not in an index, interpolation is carried out using an interpolation algorithm. For example, when linear interpolation is used as an interpolation algorithm, taking an air pressure condition P to be $P1<P<P2$ and a temperature condition C to be $C1<C<C2$ with respect to I1, ideal values of a reference I1-0 in a state of no deterioration under the relevant conditions are interpolated for four points I1-110, I1-120, I1-210, and I1-220, as shown in FIG. 9. The deterioration amount is also interpolated using an interpolation algorithm when the depreciation amount does not coincide with the depreciation point T1, T2, or the like. That is, taking a value along a temporal deterioration axis from I1-0, for example I1, to be the actual measurement value, I1-(I1-0) is the deterioration amount. Herein, T, which is the temporal deterioration axis, indicates current magnitude. Normally, I1-0 is not 0, but is taken to be 0 to facilitate understanding of the deterioration amount.

The actual current at a time of actual use also needs to be interpolated based on a value of deterioration from a reference current in an ideal state under the relevant usage conditions, because of which correction parameters with respect to each index of the condition reference tables are determined.

Figure 10:
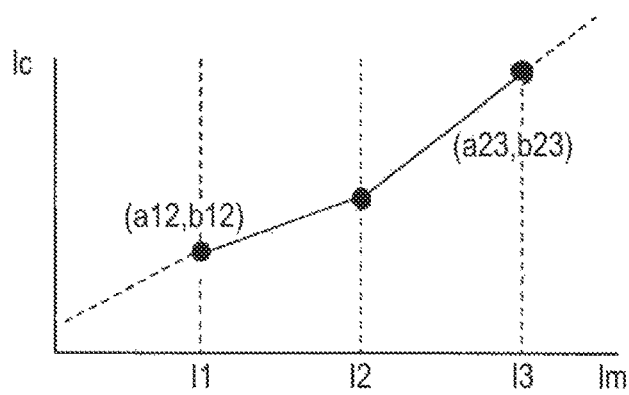
FIG. 10 is a diagram showing an example of a correction algorithm.

For example, a case of interpolating using the following kind of linear expression will be considered, as shown in FIG. 10.

$$Icorrected = a*Imeasured + bCorrection \qquad \text{Expression 1:}$$

Herein, a and b indicate correction coefficients.

Figures 11, 12A, 12B:
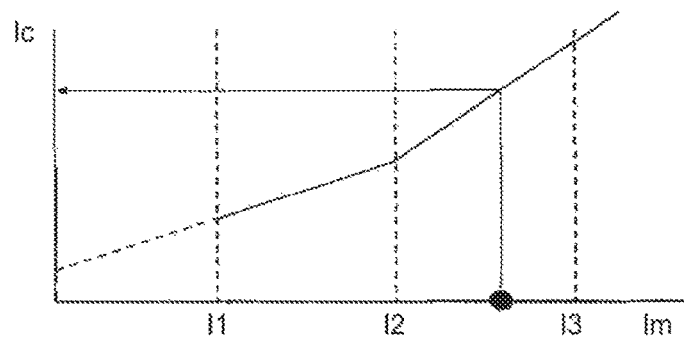
FIG. 11 is a diagram showing an example of correcting an actual measurement value.
FIG. 12A is a diagram showing an interpolation parameter table.
FIG. 12B is a diagram showing an interpolation parameter table.

In this case, as shown in FIG. 11, the corrected current value Icorrected (Ic) can be calculated from the actual current magnitude Imeasured (Im) using Correction Expression 1. Also, the correction expression can be changed for a case of a current supply smaller than I2 and a case of a current supply greater than I2.

With regard to the correction parameters, characteristics of the deterioration points T1, T2, and so on, and the upper deterioration limit point Tn have already been collected, because of which correction parameter tables for the reference currents I1 and I2 and Correction Expression 1 calculated using I2 and I3 are compiled as shown in FIGS. 12A and 12B for each condition reference table index from the data collection results of each accelerated deterioration point. FIG. 12A is a parameter table for $T0<=T<T1$, and FIG. 12B is a parameter table for $T1<=T<T2$.

Figure 13:
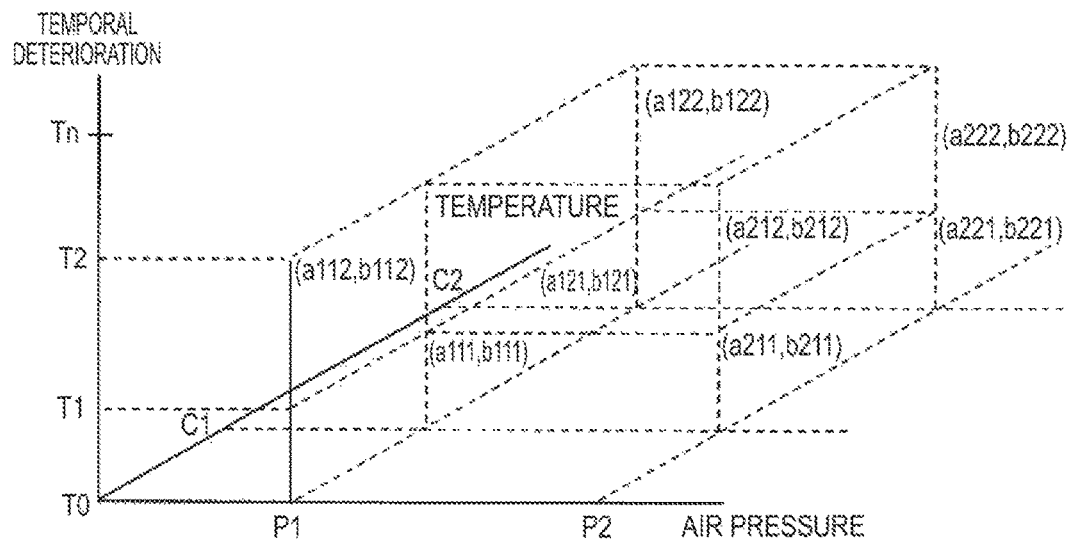
FIG. 13 is a relationship diagram showing a correction concept for an actual measurement value under a characteristic condition.

At a time of actual use, the amount of deterioration is estimated from the air pressure P and temperature C, which are external usage conditions, and the results of measuring the reference currents I1, I2, and I3, and the correction parameters a and b that correct the measurement value Im from the amount of deterioration are extracted from the correction parameter table of FIG. 12A or 12B, as shown in an actual measurement value correction concept under specific conditions shown in FIG. 13. For example, when taking the estimated temporal depreciation under the air pressure condition $P1<P<P2$ and temperature condition $C1<C<C2$ to be $T1<T<T2$ from the measurement results in the cases of the reference currents I1, I2, and I3, either the four values (a12-112, b12-112), (a12-122, b12-122), (a12-212, b12-212), (a12-222, b12-222) or (a23-112, b23-112), (a23-122, b23-122), (a23-212, b23-212), (a23-222, b23-222) are extracted in accordance with the current magnitude of Im. Furthermore, a correction expression is determined by interpolating the correction parameters a and b in accordance with the values of the air pressure condition P and temperature condition C.

When the difference between the ideal value and actual measurement value exceeds the upper deterioration limit calculated depending on the external conditions, a warning regarding element replacement is issued, and when this is not the case, an estimated residual amount is reported as necessary, the reset is cancelled, and a shift is made to the normal mode 4$b$.

In the normal mode 4$b$, the corrected current value Ic is derived with respect to the actual current value Im, using the correction parameters a and b calculated as previously described and a correction expression.

As heretofore described, the ASIC 14 is configured to have output state information with respect to the references when the protective correction target 54, which is the target of protection, is in a state of no deterioration, and deterioration state information with respect to the references at a predetermined point of use, and carries out a diagnostic evaluation of the deterioration state of the protective correction target 54 from an output signal of the protective correction target 54. Using the diagnostic function of the ASIC 14, correction can be added to the output of the protective correction target 54, and the output used as a control signal.

Second Embodiment

Figure 14:
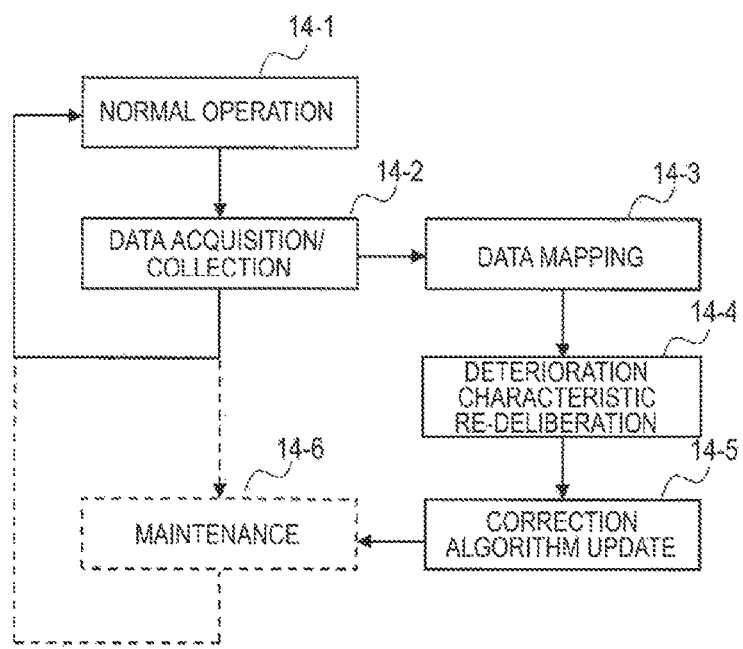
FIG. 14 is a flowchart showing a second embodiment of the invention.

An embodiment for reading aggregate results using a communication interface, and updating correction expressions and correction parameters written into a non-volatile memory, will be described using a flowchart shown in FIG. 14.

At a time of normal operation, data are measured and corrected (step 14-1) and recorded in a RAM together with measurement conditions, and the recorded results are regularly aggregated (step 14-2) and recorded in a data region of a non-volatile memory when, for example, shutting off or resetting (step 14-3). These data can be read using a communication interface, and transmitted to a data center or the like. For example, by the heretofore described operation being carried out when shutting off, a user is not made to wait until the relevant task is finished.

Offline analysis of this information can be carried out, and by comparing with data collected in the development process, the deterioration state of a correction target and dependence on external usage conditions can be verified and recognized (step 14-4). From the previously described characteristic evaluation, an addition of a correction algorithm is deliberated as necessary, and the necessity or otherwise of changing the correction expressions or parameter quantity, or updating parameter values, is determined (step 14-5). When it is determined that an update is necessary, the user is notified of the matter, operation of the device is stopped at an appropriate timing, when shutting down for example, and a shift is made to a maintenance mode. In the maintenance mode, current values (correction programs and correction parameters) of the non-volatile memory are updated using the communication interface (step 14-6). Although not over-the-air (OTA), it may in some cases be necessary to replace an electronic part, an ASIC for example. The next time the power supply is turned on after updating, calibration using the correction expressions and correction parameters after updating is implemented, and protective correction using new data is implemented after shifting to a normal mode.

Third Embodiment

Figure 15:
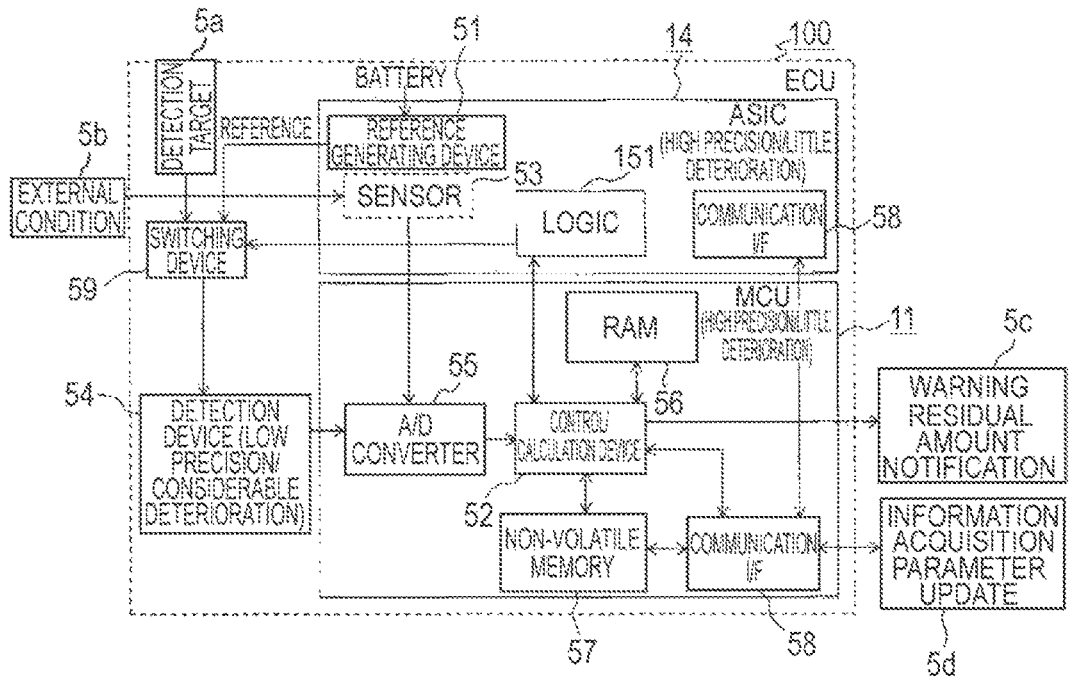
FIG. 15 is a configuration diagram of a third embodiment of the invention.

In the third embodiment, a realization method using a configuration differing from that of the first embodiment is shown. The first embodiment, as shown in FIG. 5, shows a configuration example wherein the reference generating device 51, sensor 53, A/D converter 55, RAM 56, control/calculation device 52, non-volatile memory 57, and communication interface 58 are all integrated in one electronic part but, it not being essential that everything is integrated in one electronic part, an MCU with extremely high reliability also exists, because of which one portion of the components may be replaced by a function of the MCU, and realized as an integrated environment including the ASIC. For example, as shown in FIG. 15, a configuration such that only the reference generating device 51, one portion or all of the sensor group 53, the communication interface 58 for communicating with an MCU, and a custom logic 151 are integrated as one electronic part in the ASIC 14, while for other components an MCU 11 is used, or the components are external individual parts.

In the case of this configuration, an electronic part, the ASIC 14 for example, sends external conditions acquired by a built-in or external sensor to the A/D converter 55 of the MCU 11, and a switching device is controlled via an electronic part-incorporated logic that receives a command from the MCU 11.

Application examples other than the heretofore described configuration are the same as in the first embodiment.

Fourth Embodiment

Figure 16:
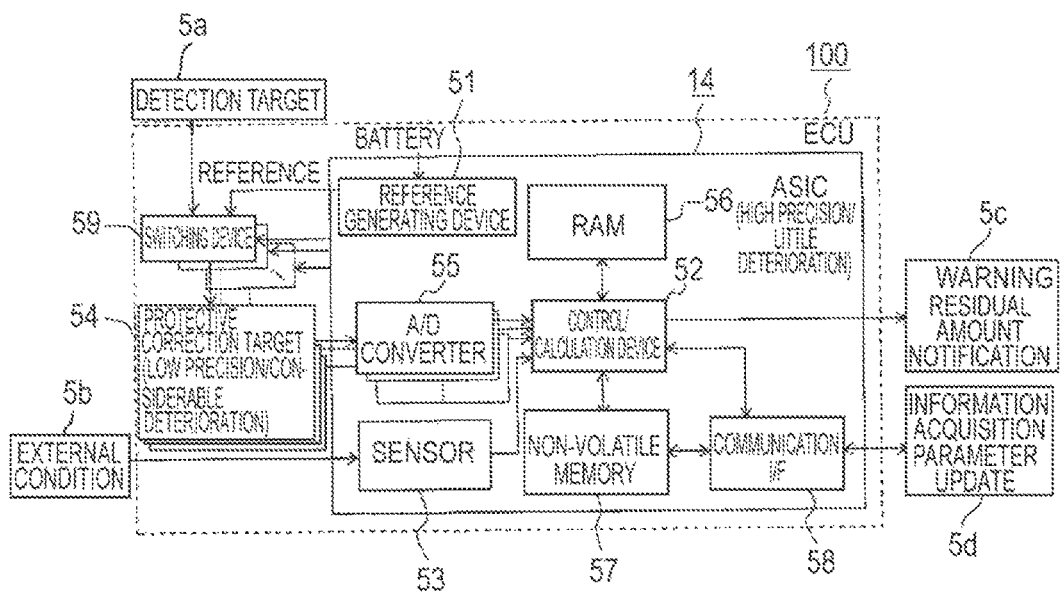
FIG. 16 is a configuration diagram of a fourth embodiment of the invention.

Furthermore, a case wherein the protective correction target is one electronic circuit is shown in the first to third embodiments, but when the electronic circuits of a multiple of protective correction targets 54 are embedded in the ECU 100, as shown in FIG. 16, a multiple of the channel A/D converter 55 that converts an analog output value from an electronic part into a digital signal are included, output from the channel A/D converter 55 is sent to the control/calculation device 52, and the deterioration state of each electronic circuit of the multiple of protective correction targets 54 can be evaluated by the control/calculation device 52 in accordance with each output signal. In this case, the protective correction targets 54 are sequentially switched by the switching device 59, and deterioration states thereof are evaluated by the output signals being sequentially switched. In the event of a problem as a result of the evaluation, a warning is issued by the device 5c, which warns that there is a problem.

The deterioration diagnosis device of the invention includes a reference table of output states with respect to references in a state wherein there is no deterioration of an electronic circuit that forms a protective correction target, and a deterioration characteristic table for each reference obtained from deterioration characteristics at predetermined points after use, wherein a deterioration state can be diagnosed by receiving an output of the electronic circuit.

Arbitrary components of the embodiments can be changed or omitted as appropriate, without departing from the scope of the invention.

What is claimed is:

1. A deterioration diagnosis device comprising:
   a micro-control unit (MCU) including a non-volatile memory; and
   an application-specific integrated circuit (ASIC) including a reference-generating device,
   wherein:
   i) the non-volatile memory is configured to store output information with respect to a reference from the reference-generating device in a state wherein there is no deterioration of a target electronic part and output information with respect to the reference in a deterioration state at a predetermined point of use,
   ii) the MCU is configured to receive an output signal of the electronic part with respect to the reference, and
   iii) the MCU is configured to carry out a diagnostic evaluation of a deterioration state of the electronic part from the output information in the state wherein there is no deterioration and the output information in the deterioration state.

2. A deterioration diagnosis device, comprising:
   a reference generating device that generates a reference;
   a non-volatile memory in which is saved output information in a state wherein there is no deterioration with respect to the reference of a target electronic part and output information in a deterioration state with respect to the reference at a predetermined point of use;
   a switching device coupled to the reference generating device and the target electronic part; and
   a control device that receives an output from the switching device and diagnoses a deterioration state of the electronic part based on the output information in the state wherein there is no deterioration and the output information in the deterioration state saved in the non-volatile memory.

3. The deterioration diagnosis device according to claim 2, wherein the electronic part is a current detection circuit, the non-volatile memory has a program that corrects a measurement value of the electronic part in accordance with the deterioration state of the electronic part, and the measurement value of the electronic part is corrected in accordance with the deterioration state of the electronic part.

4. The deterioration diagnosis device according to claim 2, wherein the electronic part is an electronic part that does not have a self-correcting function, the output information in the state wherein there is no deterioration, the output information in the deterioration state, wherein performance deterioration is evaluated by an acceleration test that applies various kinds of external environment such as temperature and air pressure, and a correction parameter and correction algorithm that give consideration to an effect of the external environment, are saved in the non-volatile memory, and the deterioration state of the electronic part is diagnosed in the control device from information on a difference between the output information in the state wherein there is no deterioration and output information in the deterioration state and a measurement result at a time of actual use.

5. The deterioration diagnosis device according to claim 2, wherein the deterioration state of the electronic part is diagnosed in the control device using a condition reference table in which is stored an expected value, which is a state wherein there is no deterioration, with a usage condition of the electronic part as an index, and an interpolation parameter table generated using a deterioration characteristic table measured at each deterioration point corresponding to each temporal change using the condition reference table, with a product lifespan as an upper deterioration limit.

6. The deterioration diagnosis device according to claim 4, comprising a communication interface, wherein the external usage condition and measurement value when the electronic part is used, and a result of correcting the output of the electronic part, are verified offline in terms of a deterioration state and dependence on the external usage condition of a correction target, and the correction parameter written into the non-volatile memory may be updated.

7. The deterioration diagnosis device according to claim 2 wherein, with a plurality of the electronic part as targets, a deterioration state is diagnosed for each of the plurality of the electronic part.

* * * * *